United States Patent
Nguyen

(10) Patent No.: US 7,414,389 B2
(45) Date of Patent: Aug. 19, 2008

(54) LOW-POWER BATTERY PACK WITH HALL-EFFECT SENSOR

(75) Inventor: Don J. Nguyen, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/453,780

(22) Filed: Jun. 14, 2006

(65) Prior Publication Data
US 2007/0290701 A1    Dec. 20, 2007

(51) Int. Cl.
*G01R 33/07* (2006.01)
*G01R 15/20* (2006.01)
*G01R 19/22* (2006.01)

(52) U.S. Cl. .............................. 324/117 H; 324/117 R; 324/120

(58) Field of Classification Search ............. 324/117 R, 324/117 H, 126–127, 251–252, 380; 323/249, 323/302, 310, 329
See application file for complete search history.

(56) References Cited

U.S. PATENT DOCUMENTS

| | | | | |
|---|---|---|---|---|
| 5,041,780 A | * | 8/1991 | Rippel | 324/117 H |
| 6,104,967 A | * | 8/2000 | Hagen et al. | 700/293 |
| 2005/0093549 A1 | * | 5/2005 | Kim | 324/380 |
| 2005/0231355 A1 | * | 10/2005 | Hair et al. | 340/538 |

* cited by examiner

*Primary Examiner*—Ha Nguyen
*Assistant Examiner*—Joshua Benitez
(74) *Attorney, Agent, or Firm*—Blakely, Sokoloff, Taylor & Zafman LLP

(57) ABSTRACT

Some embodiments of a method and apparatus to facilitate battery management using a hall-effect sensor. The apparatus includes a hall-effect sensor and a battery management unit. The hall-effect sensor is disposed near the electrical transmission line to detect an amount of current flowing through the electrical transmission line. The current originates from a direct current power source coupled to the transmission line. The power source management unit is coupled to the hall-effect sensor to process a sensor signal from the hall-effect sensor. The power source management unit also determines the amount of current flowing through the electrical transmission line. Other embodiments are described.

8 Claims, 8 Drawing Sheets

LOW-POWER BATTERY PACK WITH HALL-EFFECT SENSOR

TECHNICAL FIELD

Embodiments of this invention relate to the field of battery packs and, in particular, an aspect relates to a low-power battery pack with a hall-effect sensor.

BACKGROUND

As processing capabilities increase, mobile computing devices demand more performance and additional features. In turn, the power requirements for these mobile computing devices may increase. For example, thermal design power (TDP) for notebook platforms could reach about 80 W in the near future. The increased power requirements, in conjunction with compact platform designs, place a huge burden on the power delivery design internal to the battery pack.

Battery packs are subject to several design constraints. As the package size of electronic devices decreases, the size of battery packs may be limited. Similarly, the size of battery packs may be limited as the amount of electronics within a device increases. Also, the heat produced and dissipated by a battery pack may constrain battery pack design with respect to specified operating levels. One common source of heat within battery packs are resistive sensor elements used to measure the operating current drawn from or to the battery. Additionally, battery packs may be designed to accommodate various operating power states, depending on the operating conditions of the corresponding electronic device.

Battery pack designs are also subject to power management requirements. Many battery packs incorporate power management electronics to determine power usage. Such electronics also typically estimate how much power and operating time or both are available for continued use of the corresponding device. For example, notebook computer platforms generally notify a user of the amount of time the user may continue to use battery power to operate the notebook. This estimation is often referred to as "gas gauging" or "fuel gauging" as an analogy to the use of fuel gauges in automobiles to indicate the amount of fuel in the tank at a given time. Unfortunately, gas gauging in computing platforms is subject to errors that are not necessarily a problem in automobile fuel tanks which use mechanical floats. As electrical energy is depleted from the battery pack, the estimation of remaining operating time may be subject to inaccuracies due to the monitoring range of the power management electronics. Where little power is used such as in a low-power operating state, the inaccuracy of the estimation may be significant because the monitoring range of the power management electronics is typically static and is not calibrated to monitor low-power states.

Conventional technology for battery packs does not adequately address these design constraints. In particular, conventional battery packs suffer from significant heat generation from using series resistive elements to measure operating currents. Also, conventional battery packs suffer from inaccurate power management because of the use of static monitoring ranges.

BRIEF DESCRIPTION OF THE DRAWINGS

The present invention is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the spirit and scope of the present invention.

In general, methods and apparatuses are described for a low-power consumption battery pack design. In one embodiment, the apparatus includes a hall-effect sensor and a battery management unit. The hall-effect sensor is disposed near the electrical transmission line to detect an amount of current flowing through the electrical transmission line. The current originates from a direct current power source coupled to the transmission line. The power source management unit is coupled to the hall-effect sensor to process a sensor signal from the hall-effect sensor. The power source management unit also determines the amount of current flowing through the electrical transmission line.

One embodiment of the method includes storing electrical energy in a battery within a computing platform, outputting a current on an electrical transmission line within the computing platform, and detecting the current on the electrical transmission line using a hall-effect sensor disposed near the electrical transmission line. Other embodiments of the method also may include converting an analog sensor signal from the hall-effect sensor to a digital sensor signal, adjusting an effective range of the hall-effect sensor, matching the effective range of the hall-effect sensor to a platform power status of the computing platform, and adjusting an effective resolution of the digital sensor signal.

Certain embodiments of the method, apparatus, and system described herein offer advantages, compared to conventional technologies, including lower power dissipation and higher accuracy in battery capacity estimations. Lower power dissipation internal to the battery pack may extend battery capacity, increase life cycle performance, and improve reliability. High accuracy of the gas gauging results in more accurate estimations of remaining charge, which also increases battery life.

Figure 1:
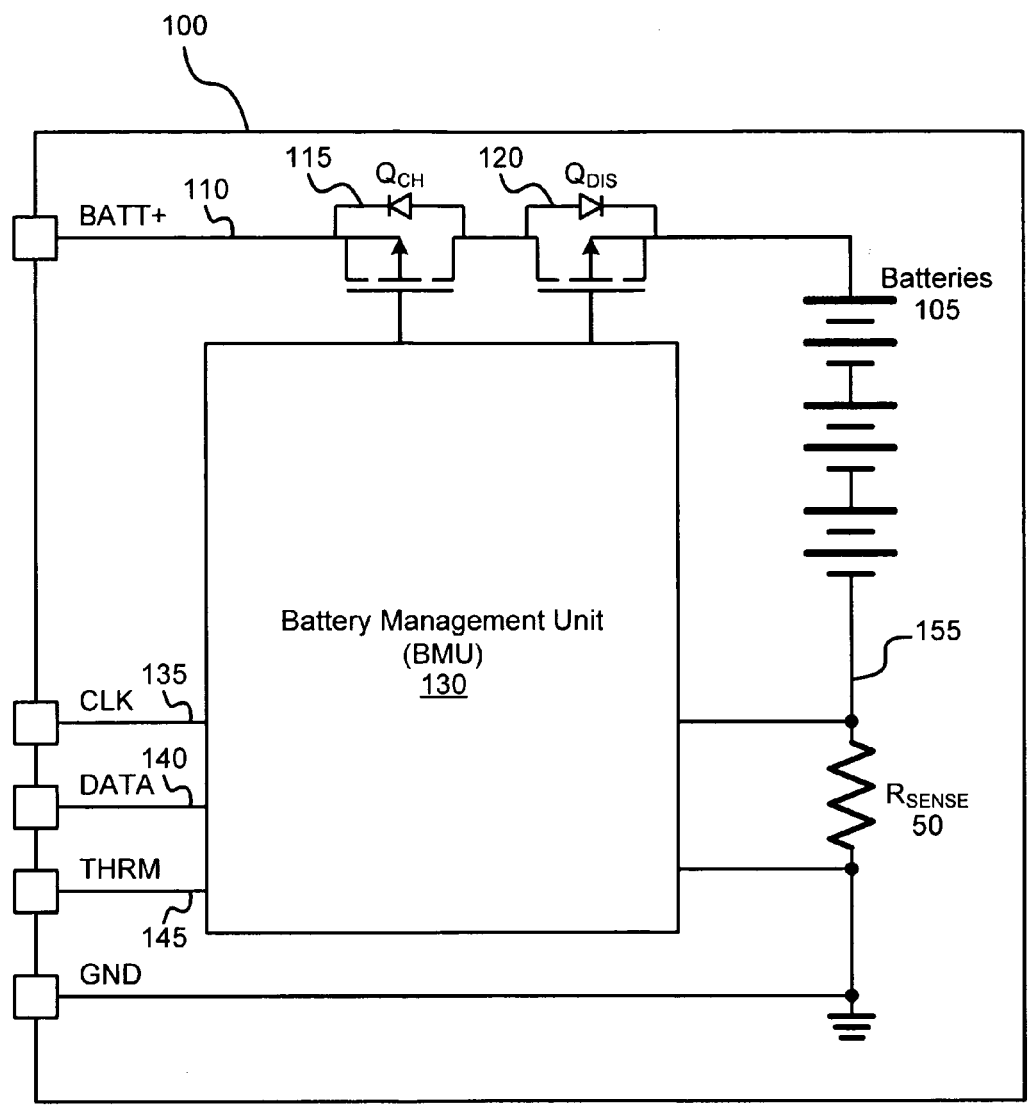
FIG. 1 illustrates a battery pack with a sense resistor to detect operating current.

FIG. 1 illustrates a battery pack 100 with a sense resistor 50 to detect operating current. The battery pack 100 may be used to provide power to a mobile computing platform such as a notebook computer. The battery pack 100 includes one or more battery cells 105 (i.e., a battery stack) to provide power to the mobile computing platform through a battery line 110, BATT+. Two transistors, a charging transistor 115, $Q_{CH}$, and a discharging transistor 120, $Q_{DIS}$, such as metal-oxide semiconductor field-effect transistors (MOSFETs) are coupled to the battery line 110 and to a battery management unit (BMU) 130. The battery management unit 130 controls the charge and discharge transistors 115 and 120 to control the current into and out of the battery cells 1015. In particular, the charge transistor 115 facilitates charging the battery cells 105, and the discharge transistor 120 facilitates discharging the battery cells 105. Discharging the battery cells 105 occurs when the mobile computing platform draws power from the battery pack 100.

The battery management unit 130 also monitors the operating current of the battery pack 100 to ensure that the battery pack 100 is operating properly (i.e., to avoid a battery pack failure) and to determine how much charge remains in the battery pack 100. The remaining charge is related to the remaining operating time that a user may continue to use the mobile computing platform. The battery management unit 130 may receive a clock signal from and communicate battery status information to the mobile computing platform via various signal lines such as a clock signal (CLK) line 135, a data signal (DATA) line 140, and a thermal signal (THRM) line 145. The CLK and DATA lines 135 and 140 implement communication protocols such as the SMBus interface compliant with Smart Battery Specifications. The THRM line 140 is used to indicate the temperature status of the battery pack to the notebook platform or to indicate the presence of a battery pack 100.

In order to monitor the operating current of the mobile computing device, the battery pack 100 implements a sense resistor 50, $R_{SENSE}$, in series with the transmission power line 155 between the battery cells 105 and the ground reference. The battery management unit 130 determines the operating current based on the resistance of the sense resistor 50 and the voltage difference across the sense resistor 50. Although the resistance of the sense resistor 50 is typically small (e.g., 10 mΩ), the power dissipation from the sense resistor 50 can be significant because of a high current demand. For example, the power dissipation is about 1 W using a sense resistor 50 of 10 mΩ and a demand current of 10 A. This power dissipation burdens the thermal solution of the battery pack 100. Additionally, this power dissipation heats up the battery cells 105, which may lead to capacity reduction, a shortened life cycle, and reduced reliability.

Additionally, the resolution of the battery management unit 130 is conventionally tied to the resistance of the sense resistor 50 and the maximum operating current of the device. For example, where the battery management unit 130 converts the analog voltage difference across the sense resistor 50 to a digital signal, the resolution of the digital signal is typically based on the maximum operating current of the device. As an example, an 8-bit analog-to-digital converter (ADC) converts the analog voltage difference to one of 256 discrete voltages. This static conversion is adequate when the device draws about the maximum operating current.

However, mobile computing platforms often draw much less than the maximum operating current in order to extend battery life. This static conversion can significantly limit the resolution of the voltage signal when the device is operating in a low-power state. For example, when the device only draws 1 A, the resolution may be limited to about 25 discrete voltages (e.g., 1/10th of the range of the 8-bit ADC because the operating current is 1/10th of the maximum operating current). This limited resolution increases the possibility for significant errors when estimating the remaining charge of the battery pack 100.

Figure 2A:
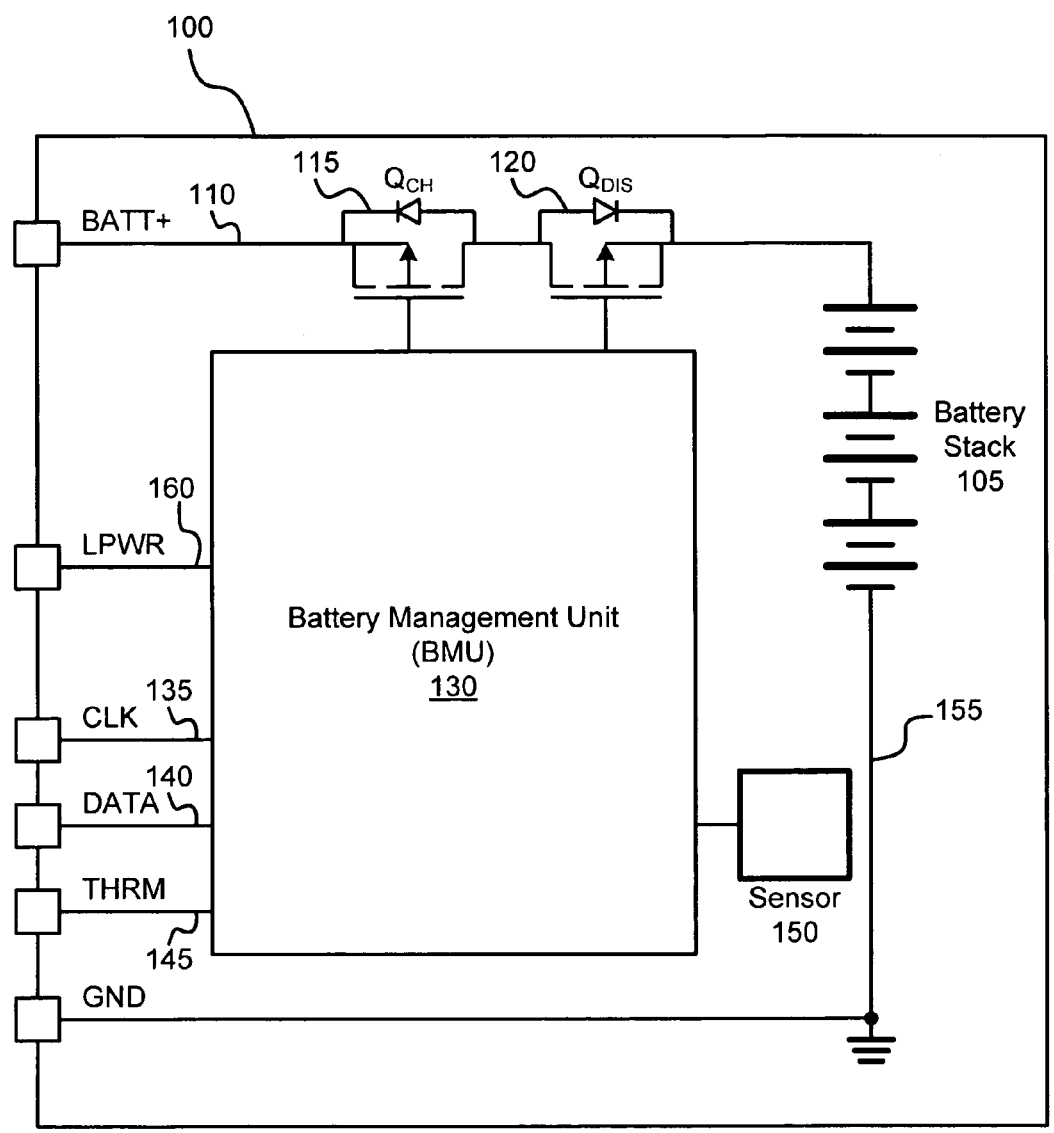
FIG. 2A illustrates one embodiment of a battery pack which uses a hall-effect sensor to detect operating current.

FIG. 2A illustrates one embodiment of a battery pack 100 which uses a hall-effect sensor 150 to detect operating current. The battery pack 100 includes a battery stack 105 coupled to a battery line 110. In one embodiment, the battery stack 105 is a Lithium-Ion, 4-series, 3-series, 2-series, or 1-series battery stack. Lithium-Ion (Li-Ion) batteries have a high energy density content, which provides higher capacity or battery life for notebook computer. However, due to the high energy density content, Li-Ion batteries may require a higher level of protection against battery failures, compared to other types of battery chemistries such as Nickel Metal Hydride (NiMH) or Nickel-Cadmium (NiCad). Alternatively, the battery stack 105 may be another type of battery chemistry.

A charge transistor 115 and a discharge transistor 120 are coupled to the battery line 110 between an external electrical contact and the battery stack 105. In one embodiment, the transistors 115 and 120 are p-channel MOSFETs to control the current into (i.e., charge) and out of (i.e., discharge) the battery stack 105. Alternatively, other types of transistors, or another type of current control circuit, may be implemented to control the current into and out of the battery stack 105. In one embodiment, the battery management unit 130 controls the charge and discharge transistors 115 and 120, as well as other functions of the battery management unit 130, according to the clock, data, and thermal signals received from the mobile computing platform via the clock signal line 135, the data signal line 140, and the thermal signal line 145, respectively. In one embodiment, the clock and data signals may comply with a smart battery specification such as the System Management Bus (SMBus) Specification.

Instead of using a sense resistor 50 such as the resistor used in the battery pack shown in FIG. 1, the battery pack 100 of FIG. 2 implements an analog transducer 150 to determine the current on the transmission power line 155 between the battery stack 105 and the ground reference. In one embodiment, the analog transducer 150 is a hall-effect sensor, although other types of analog transducers 150 may be implemented in some embodiments. For convenience, some embodiments using a hall-effect sensor 150 are described, although other embodiments may use other types of analog transducers 150. The hall-effect sensor 150 senses the electromagnetic field generated by the current in the transmission line 155. Depending on the proportional field detected by the hall-effect sensor 150, the battery management unit 130 determines the battery current flow across the transmission line 155. In one embodiment, the hall-effect sensor 150 communicates a sensor signal to the battery management unit 130. For example, the hall-effect sensor 150 may output a voltage signal (e.g., referenced to ground) to the battery management unit 130. The power dissipation of the hall-effect sensor 150 is relatively low, compared to the power dissipation of a series sense resistor. Therefore, one embodiment of the hall-effect sensor 150 resolves at least some of the power dissipation problems associated with the sense resistor 50 of the battery pack of FIG. 1.

In another embodiment, the battery pack 100 also includes a low power signal line 160 to interface with the mobile computing platform in which the battery pack 100 operates. The low power signal line 160 may allow the mobile computing platform to communicate a processor power state to the battery management unit 130 so that the battery management unit 130 may adapt the power management operations of the battery management unit 130 to the power state of the processor. In other words, the battery management unit 130 dynamically modifies how the operating current is monitored, according to the power state in which the processor is operating. In one embodiment, the power states of the mobile computing platform conform to the power states defined in the Advanced Configuration and Power Interface (ACPI) open standard. See, Advanced Configuration and Power Interface Specification, Revision 3.0a, published by Hewlett-Packard Corporation, Intel Corporation, Microsoft Corporation, Phoenix Technologies Ltd., and Toshiba Corporation, Dec. 30, 2005, currently available at http://www.acpi.info. For example, processors may operate in various "C" power states ranging from C0 (full power) to C4 (low power), although other power states may be defined and implemented.

In one embodiment, the capability to dynamically modify how the operating current is monitored includes the capability to change a monitoring range of the hall-effect sensor 150. For example, when the computing platform indicates that it is operating in a low-power state (e.g., drawing 1.0 A from the battery stack), the battery management unit 130 may implement a monitoring range of 0-2 A for the hall-effect sensor 150. This dynamic modification of the monitoring range may dramatically improve the accuracy and linearity of the current-to-voltage translation. Although the technology to dynamically modify the monitoring range of the battery pack 100 is described in terms of using a hall-effect sensor 150, other types of battery packs also may benefit from implementing a similar dynamic monitoring range.

Figure 2B:
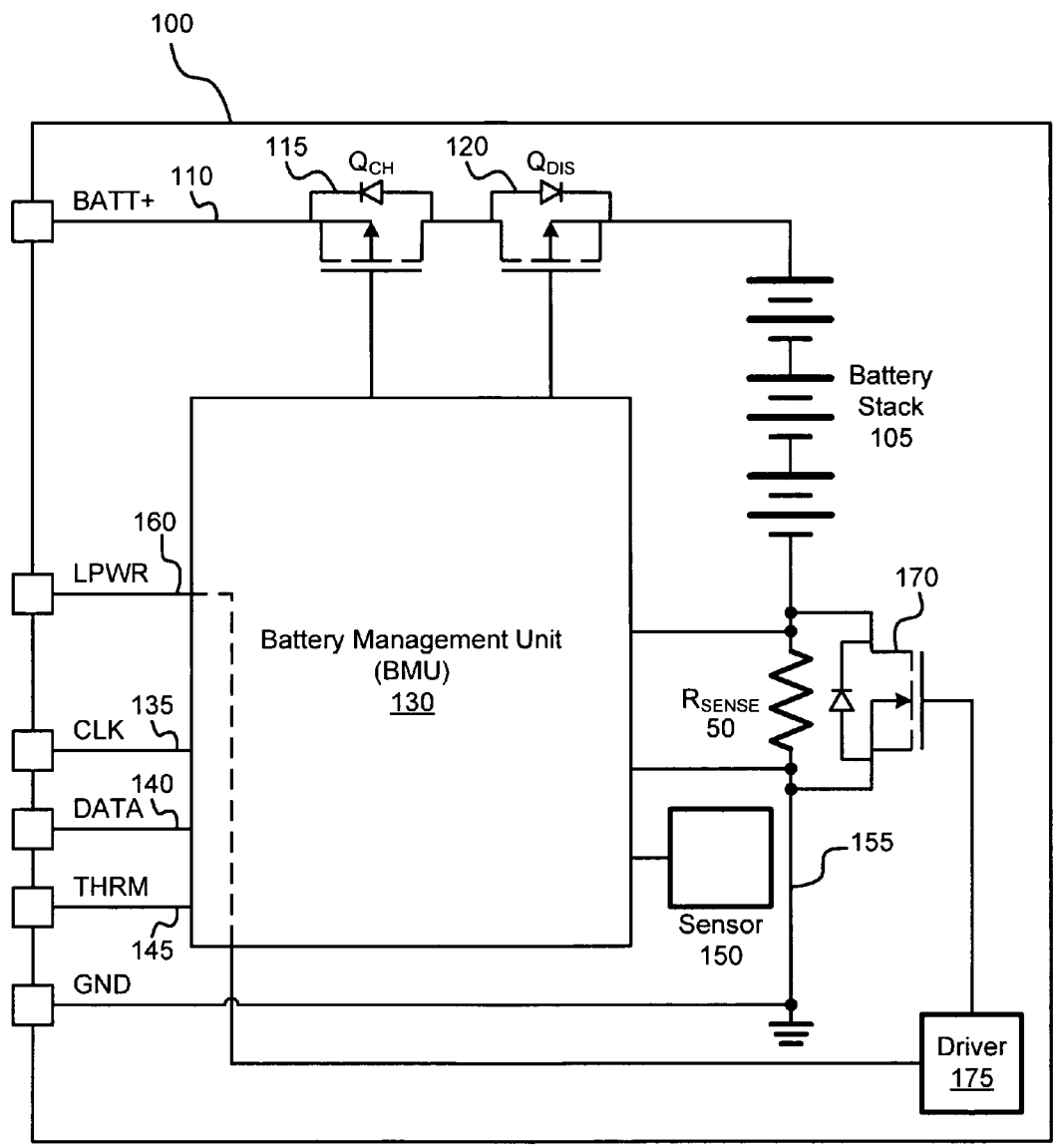
FIG. 2B illustrates another embodiment of a battery pack which uses a hall-effect sensor and a sense resistor to detect operating current.

FIG. 2B illustrates another embodiment of a battery pack 100 which uses a hall-effect sensor 150 and a sense resistor 50 to detect operating current. In one embodiment, the battery management unit 130 may use signals from one or both of the hall-effect sensor 150 and the sense resistor 50. As one example, the battery management unit 130 may use the signal from the sense resistor 50 at relatively high operating currents and the signal from the hall-effect sensor 150 at relatively low operating currents. Other embodiments may implement other schemes to use the signals.

The illustrated battery pack 100 also include a "bypass" transistor 170 and a driver 175 coupled to the bypass transistor 170. In one embodiment, the bypass transistor 170 is a MOSFET with a low on-resistance, although other types of bypass circuits may be used. Alternatively, other bypass switching devices may be used to fully or partially "remove" the sense resistor 50 from the sensing circuit. In one embodiment, the driver 175 turns on the bypass transistor 170 in order to minimize the amount of current flowing through the sense resistor 50. In this way, the hall-effect sensor 150 may be used, for example, to monitor the current flow at low operating currents. In some embodiments, the driver 175 is a simple buffer that accepts a CMOS logic-level signal such as the low power signal and drives (i.e., outputs) a higher current output to properly drive the gate of the MOSFET transistor 175. This type of driver 175 is well known and is not described in more detail herein. Alternatively, other types of drivers 175 may be used depending on the type of bypass switch implemented. Additionally, although the driver 175 is shown separate from the battery management unit 130, some embodiments of the battery management unit 130 may include the driver 175.

Figure 3A:
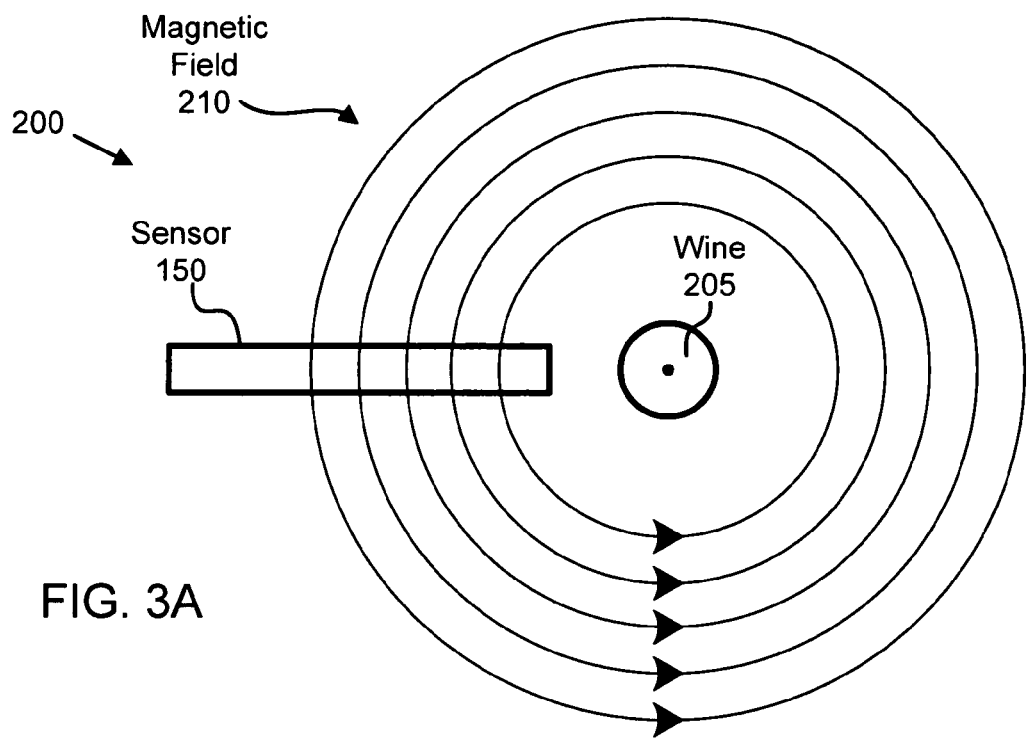
FIG. 3A illustrates a sensor system which implements one embodiment of a hall-effect sensor.

FIG. 3A illustrates a sensor system 200 which implements one embodiment of a hall-effect sensor 150. The hall-effect sensor 150 is disposed near a wire 205 which carries an electrical current (shown traveling out of and transverse to the plane of the figure). The electrical current in the wire generates a magnetic field 210 around the wire 205. The hall-effect sensor 150 detects the magnetic field 210 and generates a voltage signal proportional to the magnitude of the magnetic field 210.

Figure 3B:
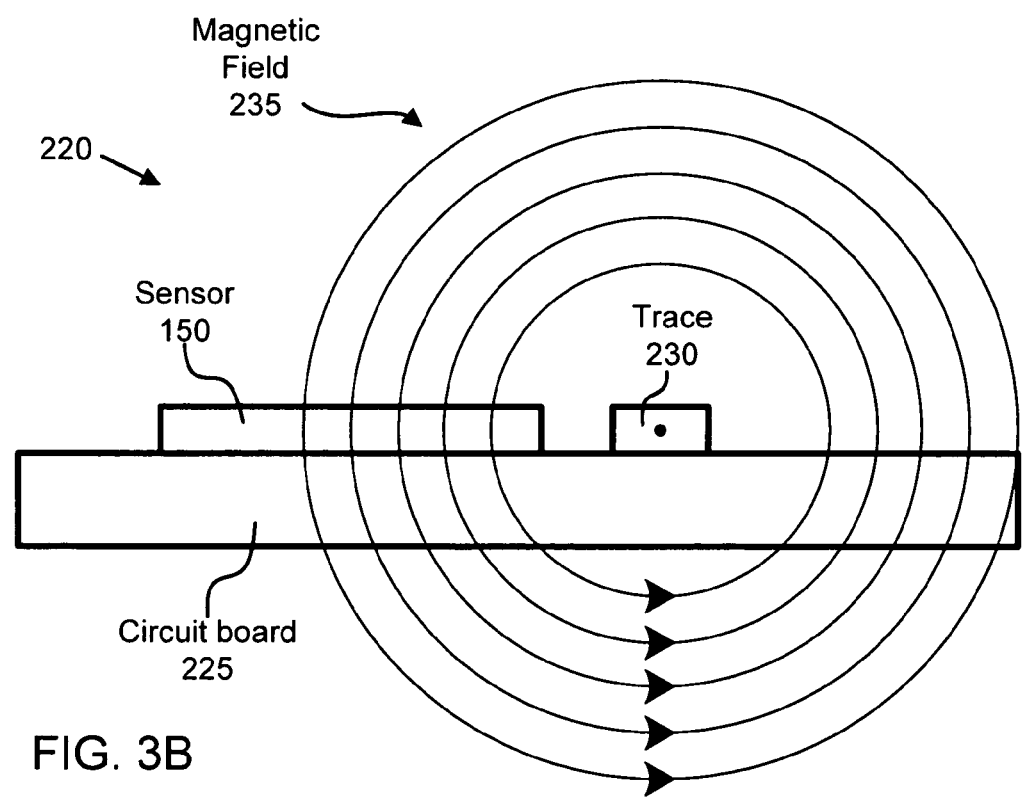
FIG. 3B illustrates another sensor system which implements another embodiment of a hall-effect sensor.

FIG. 3B illustrates another sensor system 220 which implements another embodiment of a hall-effect sensor 150. In this embodiment, the hall-effect sensor 150 is disposed on a printed circuit board (PCB) 225 near a transmission trace 230. The transmission trace 230 carries an electrical current, which generates a magnetic field 235 around the transmission trace 230. The hall-effect sensor 150 detects the magnetic field 235 and generates a voltage signal proportional to the magnitude of the magnetic field 235.

Figure 4:
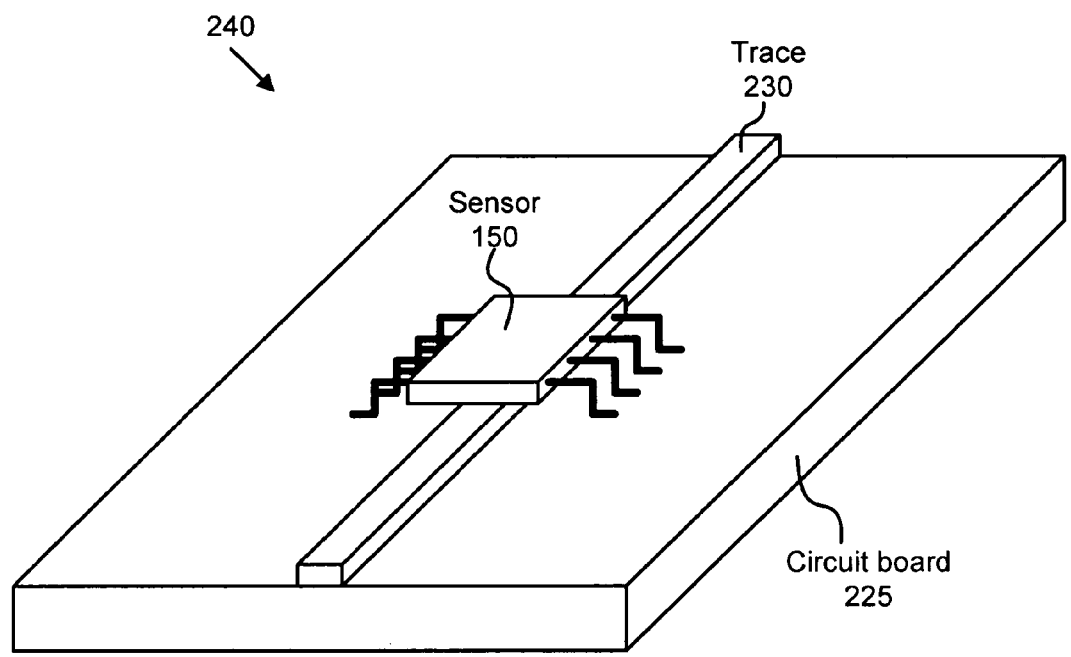
FIG. 4 illustrates a perspective view of another sensor system which implements another embodiment of a hall-effect sensor.

FIG. 4 illustrates a perspective view of another sensor system 240 which implements another embodiment of a hall-effect sensor 150. The depicted sensor system 240 includes a transmission trace 230 on a circuit board 225 such as a printed circuit board. The transmission trace 230 is used to carry current to and from the battery stack 105. The hall-effect sensor 150 is disposed above the transmission trace 230 to provide magnetic coupling when current flows through the transmission trace 230. In one embodiment, the hall-effect sensor 150 is disposed on a layer adjacent to the transmission trace 230. In another embodiment, one or more additional layers are between the hall-effect sensor 150 and the transmission trace 230. In another embodiment, there is an air gap between the hall-effect sensor 150 and the transmission trace 230.

Figure 5:
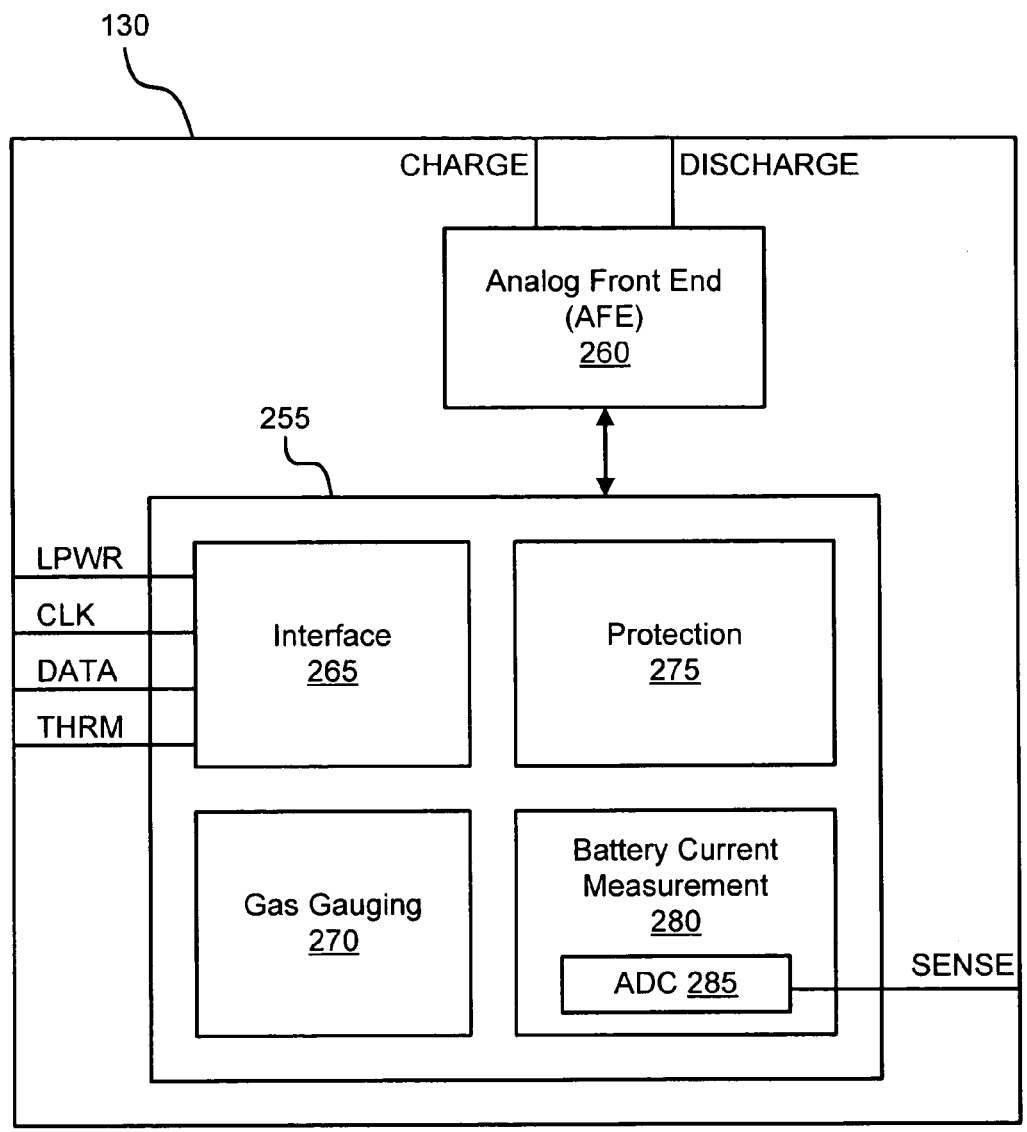
FIG. 5 illustrates one embodiment the battery management unit (BMU).

FIG. 5 illustrates one embodiment the battery management unit (BMU) 130. The depicted battery management unit 130 includes a microcontroller (MC) 255 and an analog front end (AFE) 260. The microcontroller 255 includes an interface 265, a gas gauging module 270, a protection module 275, and a battery current measurement module 280. The battery current measurement module 280 includes an analog-to-digital converter (ADC) 285. Alternative embodiments of the battery management unit 130, microcontroller 255, and analog front end 260 may include fewer or more components. Moreover, the microcontroller 255 and the analog front end 260 may be fabricated on a single chip or on separate chips.

In one embodiment, the analog front end 260 interfaces with the microcontroller 255 to control the charge and discharge transistor circuits 115 and 120. The microcontroller 255, in general, monitors the performance of the battery pack 100. The interface 265 facilitates communications with the mobile computing platform in which the battery pack 100 is installed. Exemplary signal lines coupled to the interface 265 include the clock signal line, the data signal line, the thermal signal line, and the low power signal line, which are each described above. Other embodiments of the interface 265 may include more or less lines depending on the particular implementation. For example, other embodiments may include other signal lines to comply with future versions of the SMBus Specification.

In one embodiment, the gas gauging module 270 determines how much charge remains in the battery stack 105 at a particular time. The gas gauging module 270 make this determination based on the total capacity of the battery stack 105, how much charge has been depleted over a given discharge time, and how much charge has been reintroduced into the battery stack 105 over a given charge time. In this way, the gas gauging module 270 may operate similar to a fuel gauge of an automobile, by showing how much fuel has been used compared to the total capacity of the fuel tank. In alternative embodiments, other types of gauging technologies may be implemented, including directly measuring the actual charge in the battery stack 105.

The protection module 275 protects the battery pack 100 from potentially dangerous under-voltage and over-voltage conditions. Likewise, the protection module 275 protects the battery pack 100 from dangerously high and dangerously low currents. Similarly, the protection module 275 protects the battery pack 100 from potentially dangerous temperature conditions. In one embodiment, the protection module 275 shuts down (i.e., disconnects) the battery pack 100 if one or more potentially dangerous operating conditions occur. The protection module 275 may interface with the analog front end 260, the battery current measurement module 280, or other components of the battery pack 100 to evaluate the operating conditions.

In one embodiment, the battery current measurement module 280 is coupled to the hall-effect sensor 150 to receive the sensor signal and convert the sensor signal to a digital signal. The analog-to-digital converter 285 may be any type of suitable ADC such as a flash ADC or another type of ADC. Furthermore, the analog-to-digital converter 285 may have 8-bit resolution, 14-bit resolution, or another resolution. As an example, an 8-bit ADC would have 256 quantization levels, which would result in a voltage resolution of approximately 39.0 mV for a full-scale range of 10.0 V. Similarly, a 14-bit ADC would have 16384 quantization levels, which would result in a voltage resolution of approximately 0.7 mV for a full-scale range of 10.0 V.

In another embodiment, the battery current management module 280 dynamically adjusts the monitoring range of the analog-to-digital converter 285 based on the power state of the mobile computing platform. For example, if the mobile computing platform enters a low power state, the battery current measurement module 280 modifies the full-scale range of an 8-bit analog-to-digital converter from 10.0 V to 2.0 V. In this way, the voltage resolution will be approximately 0.8 mV, instead of 39.0 mV, over the range from 0.0 V to 2.0 V. In other words, modifying the resolution to correspond to the power state may provide 256 quantization levels in the range of 0-2 V, instead of about 51 quantization levels in the range of 0-2 V if the full-scale range were 10.0 V.

Figure 6:
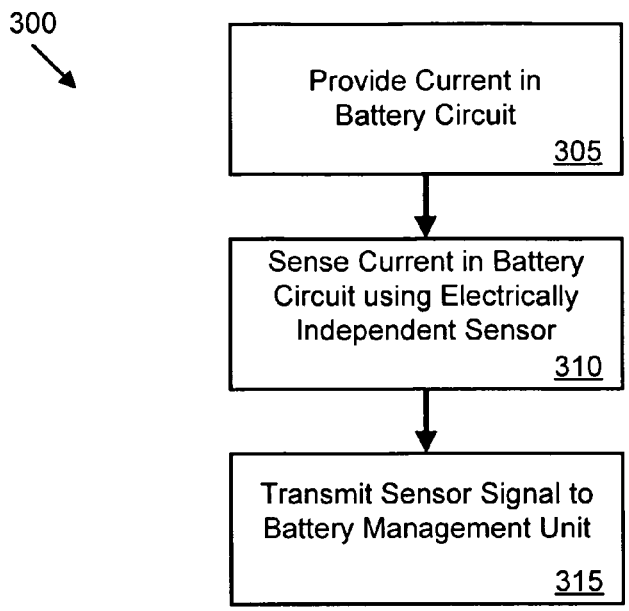
FIG. 6 illustrates one embodiment of a current sensing method which uses a hall-effect sensor.

FIG. 6 illustrates one embodiment of a current sensing method 300 which uses a hall-effect sensor 150. Although the current sensing method 300 is described in terms of a hall-effect sensor 150, other embodiments of the current sensing method 300 may be implemented with other, similar sensing technologies which are not directly coupled in series with the transmission power line 155.

The depicted current sensing method 300 begins and the battery pack 100 provides 305 a current in the battery circuit and, in particular, the transmission line 155. The battery management unit 130 then senses 310 the current on the transmission line using an electrically independent sensor such as the hall-effect sensor 150. As used herein, the term "electrically independent" means that the current in the transmission line 155 is not the same as the electrical current in the sensor 150. The hall-effect sensor 150 then transmits 315 a sensor signal to the battery management unit 130, which may process and analyze the sensor signal to determine the remaining charge of the battery stack 105, the power consumption of the mobile computing platform, and so forth.

Figure 7:
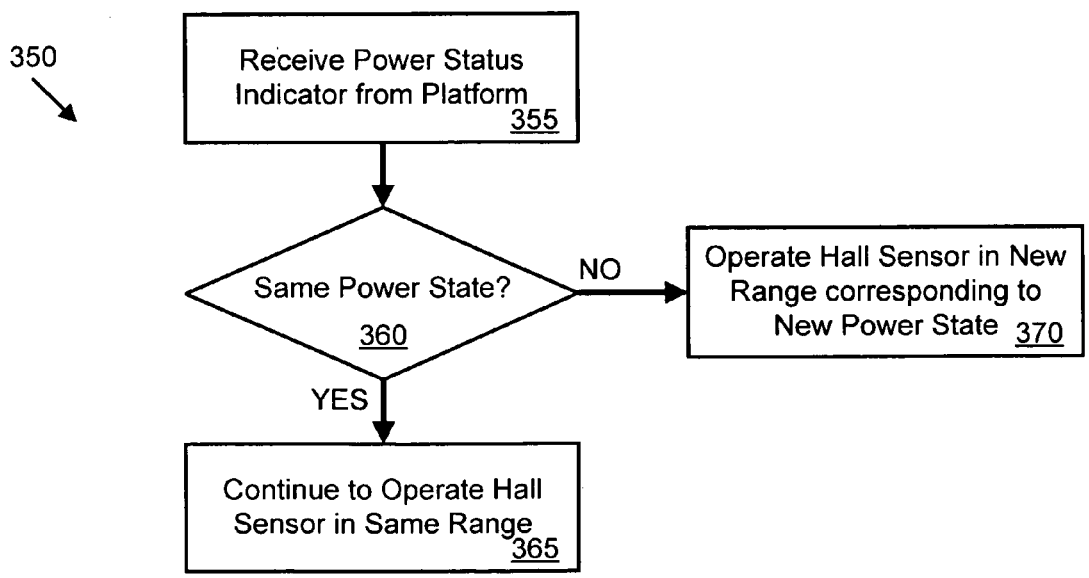
FIG. 7 illustrates one embodiment of a range adjustment method which may be implemented in conjunction with a hall-effect sensor.

FIG. 7 illustrates one embodiment of a range adjustment method 350 which may be implemented in conjunction with a hall-effect sensor 150. Alternatively, the range adjustment method 350 may be implemented in conjunction with another type of battery pack, including a battery pack having a series sense resistor. The depicted range adjustment method 350 begins and the battery management unit 130 receives 355 a power status indicator from the mobile computing platform. In one embodiment, the battery management unit 130 receives the power status indicator in the form of a low power signal on the low power signal line 160.

The battery management unit 130 then determines 360 if the received power indicator corresponds to the current power state or a new power state of the mobile computing platform. In one embodiment, the battery management unit 130 makes this determination in order to operate the battery management unit 130 in an operating state which corresponds to the power state of the platform. If the battery management unit 130 determines 360 that the platform is in the same power state as before, then the battery management unit 130 continues to operate 365 the hall-effect sensor 150 in the same range as before. In other words, the battery current measurement module 280 does not modify the monitoring range of the analog-to-digital converter 285. However, if the battery management unit 130 determines 360 that the platform is in a different power state from the previous power state, then the battery management unit 130 may operate 370 the hall-effect sensor 150 in a new range corresponding to the new power state. For example, if the previous power state was "normal power" with a corresponding full-scale range of 10.0 V, and the new power state is "low power" with a corresponding full-scale range of 2.0 V, then the battery current measurement module 280 may modify the monitoring range of the analog-to-digital converter 285 from 10.0 V to 2.0 V. This modification allows the full-scale range of the ADC 285 to at least approximately match the full-scale operating range of the platform. Thus, the voltage resolution of the ADC 285 is increased (or decreased) to match the power state of the platform.

Figure 8:
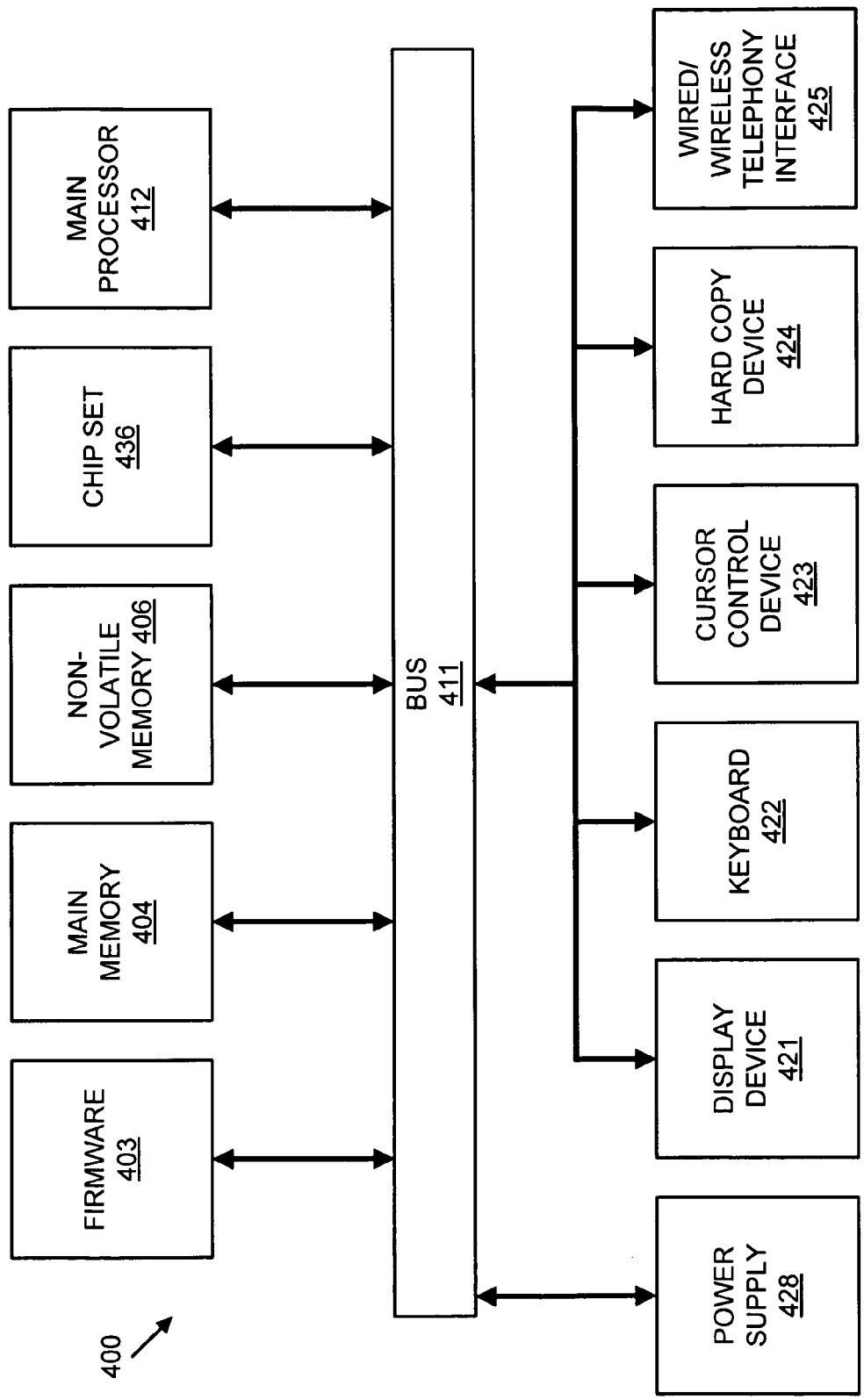
FIG. 8 illustrates one embodiment of a computing platform in which a low power battery pack with a hall-effect sensor may be implemented.

FIG. 8 illustrates one embodiment of a computing platform 400 in which a low power battery pack 100 with a hall-effect sensor 150 may be implemented. In one embodiment, the computing platform 400 may be a mobile device. Examples of mobile devices include a laptop computer, a cell phone, a personal digital assistant, or other similar device with on board processing power and wireless communications ability that is powered by a direct current (DC) power source such as a fuel cell or a battery which supplies DC voltage to the mobile device and is solely within the mobile device. Additionally, the DC power source may be recharged on a periodic basis.

In one embodiment, the computer system 400 comprises a communication mechanism or bus 411, for communicating information, and an integrated circuit component such as a main processing unit 412 coupled with bus 411 for processing information. One or more of the components or devices in the computer system 400 such as the main processing unit 412 or a chipset 436 may be powered by the DC power source. The main processing unit 412 may include one or more processor cores working together as a unit.

The computer system 400 further comprises a random access memory (RAM) or other dynamic storage device 404 (referred to as main memory) coupled to the bus 411 for storing information and instructions to be executed by the main processing unit 412. The main memory 404 also may be used for storing temporary variables or other intermediate information during execution of instructions by the main processing unit 412. The computer system 400 also includes a read-only memory (ROM) and/or other static storage device 406 coupled to the bus 411 for storing static information and instructions for the main processing unit 412. The static storage device 406 may store operating system (OS) level and application level software.

The firmware 403 may be a combination of software and hardware, such as electronically programmable read-only memory (EPROM), which has the operations for the routine recorded on the EPROM. The firmware 403 may include embedded foundation code, basic input/output system code (BIOS), or other similar code. The firmware 403 may make it possible for the computer system 400 to boot itself.

Additionally, the computer system 400 may be coupled to or have an integral display device 421, such as a cathode ray tube (CRT) or liquid crystal display (LCD), coupled to the bus 411 to display information to a computer user. In one embodiment, the chipset 436 may interface with the display device 421.

An alphanumeric input device (keyboard) 422, including alphanumeric and other keys, also may be coupled to the bus 411 for communicating information and command selections to the main processing unit 412. Furthermore, a cursor control device 423, such as a mouse, trackball, trackpad, stylus, or cursor direction keys, may be coupled to the bus 411 for communicating direction information and command selections to the main processing unit 412, and for controlling cursor movements on the display device 421. In one embodiment, the chipset 436 may interface with the I/O devices. Similarly, devices capable of making a hardcopy 424 of a file, such as a printer, scanner, copy machine, etc., also may interact with the input/output chipset 436 and bus 411.

A power supply 428 such as a DC power source may be coupled to the bus 411. In one embodiment, the DC power source is a battery and alternating current (AC) adapter circuit. Furthermore, a sound recording and playback device, such as a speaker and/or microphone (not shown), may optionally be coupled to the bus 411 for audio interfacing with computer system 400. A wireless communication module 425 also may be coupled to the bus 411. The wireless communication module 425 may employ a wireless application protocol (WAP) to establish a wireless communication channel. The wireless communication module 425 may implement a wireless networking standard such as Institute of Electrical and Electronics Engineers (IEEE) 802.11 standard, IEEE std. 802.11-1999, published by IEEE in 1999. In other embodiments, other types of wireless technologies may be implemented in the computer system 400.

Embodiments of the present invention include various operations, which as described herein. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; electrical, optical, acoustical, or other form of propagated signal (e.g., carrier waves, infrared signals, digital signals, etc.); or another type of medium suitable for storing electronic instructions.

Additionally, some embodiments may be practiced in distributed computing environments where the machine-readable medium is stored on and/or executed by more than one computer system. In addition, the information transferred between computer systems may either be pulled or pushed across the communication medium connecting the computer systems.

The digital processing device(s) described herein may include one or more general-purpose processing devices such as a microprocessor or central processing unit, a controller, or the like. Alternatively, the digital processing device may include one or more special-purpose processing devices such as a digital signal processor (DSP), an application specific integrated circuit (ASIC), a field programmable gate array (FPGA), or the like. In an alternative embodiment, for example, the digital processing device may be a network processor having multiple processors including a core unit and multiple microengines. Additionally, the digital processing device may include any combination of general-purpose processing device(s) and special-purpose processing device(s).

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. Moreover, the use of exemplary phrases such as "one embodiment," "another embodiment," "an alternative embodiment," and other similar phrases should not be understood to require mutually exclusive embodiments. The specification and drawings are, accordingly, to be regarded in an illustrative sense rather than a restrictive sense.

What is claimed is:

1. A method, comprising:
storing electrical energy in a direct current power source within a computing platform;
outputting a current on an electrical transmission line within the computing platform;
detecting the current on the electrical transmission line using a hall-effect sensor disposed near the electrical transmission line;
adjusting an effective range of the hall-effect sensor; and
matching the effective range of the hall-effect sensor to a platform power status of the computing platform.

2. The method of claim 1, further comprising converting an analog sensor signal from the hall-effect sensor to a digital sensor signal.

3. The method of claim 1, further comprising adjusting an effective resolution of the digital sensor signal.

4. An apparatus, comprising:
- means for storing electrical energy within a computing platform;
- means for transmitting the electrical energy to an electrical load within the computing platform;
- means for measuring a current flow of the computing platform using indirect electromagnetic coupling;
- means for adjusting an effective measurement range of the analog sensor signal;
- means for adjusting a resolution of the digital sensor signal; and
- means for predicting an operating time of the computing platform based on the current flow.

5. The apparatus of claim 4, further comprising:
- means for generating an analog sensor signal based on the current draw; and
- means for converting the analog sensor signal to a digital sensor signal.

6. A system, comprising:
- a computing platform;
- a direct current power source coupled to the computing platform to store electrical charge and to provide electrical power to the computing platform via an electrical transmission line;
- a hall-effect sensor disposed near the electrical transmission line to detect an amount of current flowing through the electrical transmission line; and
- a power source management unit coupled to the hall-effect sensor, the power source management unit including:
  - a current measurement module having an analog-to-digital converter,
  - wherein the analog-to-digital converter is configured to convert an analog sensor signal from the hall-effect sensor to a digital sensor signal,
  - an analog front end coupled to a charge transistor to drive the charge transistor to charge the direct current power source, and the analog front end coupled to a discharge transistor to drive the discharge transistor to facilitate operation of the computing platform,
  - a power gauging module to determine how much electrical energy is stored in the direct current power source,
  - a protection module to protect the direct current power source from a potential failure event, and
  - an interface to interface with a system processor of the computing platform.

7. The system of claim 6, wherein the computing platform comprises a mobile computing platform.

8. A system, comprising:
- a computing platform;
- a direct current power source coupled to the computing platform to store electrical charge and to provide electrical power to the computing platform via an electrical transmission line; and
- a hall-effect sensor disposed near the electrical transmission line to detect an amount of current flowing through the electrical transmission line, wherein an effective range of the hall-effect sensor is adjusted to a platform power status of the computing platform.

\* \* \* \* \*